United States Patent [19]

Lilley et al.

[11] Patent Number: 4,819,196

[45] Date of Patent: Apr. 4, 1989

[54] DIGITAL-BASED PHASE CONTROL SYSTEM

[75] Inventors: Martin A. Lilley, Fremont; Jan S. Wesolowski, Redwood City, both of Calif.

[73] Assignee: Ampex Corporation, Redwood City, Calif.

[21] Appl. No.: 49,862

[22] PCT Filed: Oct. 17, 1986

[86] PCT No.: PCT/US86/02169

§ 371 Date: Feb. 27, 1987

§ 102(e) Date: Feb. 27, 1987

[87] PCT Pub. No.: WO87/02490

PCT Pub. Date: Apr. 23, 1987

[51] Int. Cl.$^4$ ............................ G06J 1/00; H03L 7/06
[52] U.S. Cl. ...................................... 364/602; 331/11; 331/25
[58] Field of Search ............... 364/602, 724, 726, 715, 364/607; 331/11, 177 R, 18, 25; 328/35, 7 L, 133, 155; 307/262, 269, 511, 582; 323/212; 375/111; 455/139; 358/148

[56] References Cited

U.S. PATENT DOCUMENTS

| | | | |
|---|---|---|---|
| 2,956,236 | 10/1960 | Hügenholtz et al. | 331/4 |
| 4,035,735 | 7/1977 | Akoshi | 328/155 X |
| 4,122,487 | 10/1978 | Beaulier et al. | 331/25 X |
| 4,330,717 | 5/1982 | Coleman | 328/133 X |
| 4,486,846 | 12/1984 | McCallister et al. | 364/607 |
| 4,490,688 | 12/1984 | Borras et al. | 331/17 X |
| 4,546,328 | 10/1985 | Smith et al. | 331/25 X |
| 4,580,100 | 4/1986 | Suzuki et al. | 331/25 X |
| 4,626,796 | 12/1986 | Elder | 331/25 X |

*Primary Examiner*—Jerry Smith
*Assistant Examiner*—Charles B. Meyer
*Attorney, Agent, or Firm*—Elizabeth E. Strnad; Richard P. Lange

[57] ABSTRACT

A system and method for controlling the phase of an output signal relative to the phase of a reference signal are described. A function generator receives a phase control input signal and generates a predetermined periodic waveform having a selected phase displacement with respect to the phase control input signal. A desired phase displacement of the generated waveform is provided in a digital manner by selecting and storing a set of digital values representing samples of the phase displaced waveform. The phase displaced waveform is generated from the set of stored digital sample values.

15 Claims, 6 Drawing Sheets

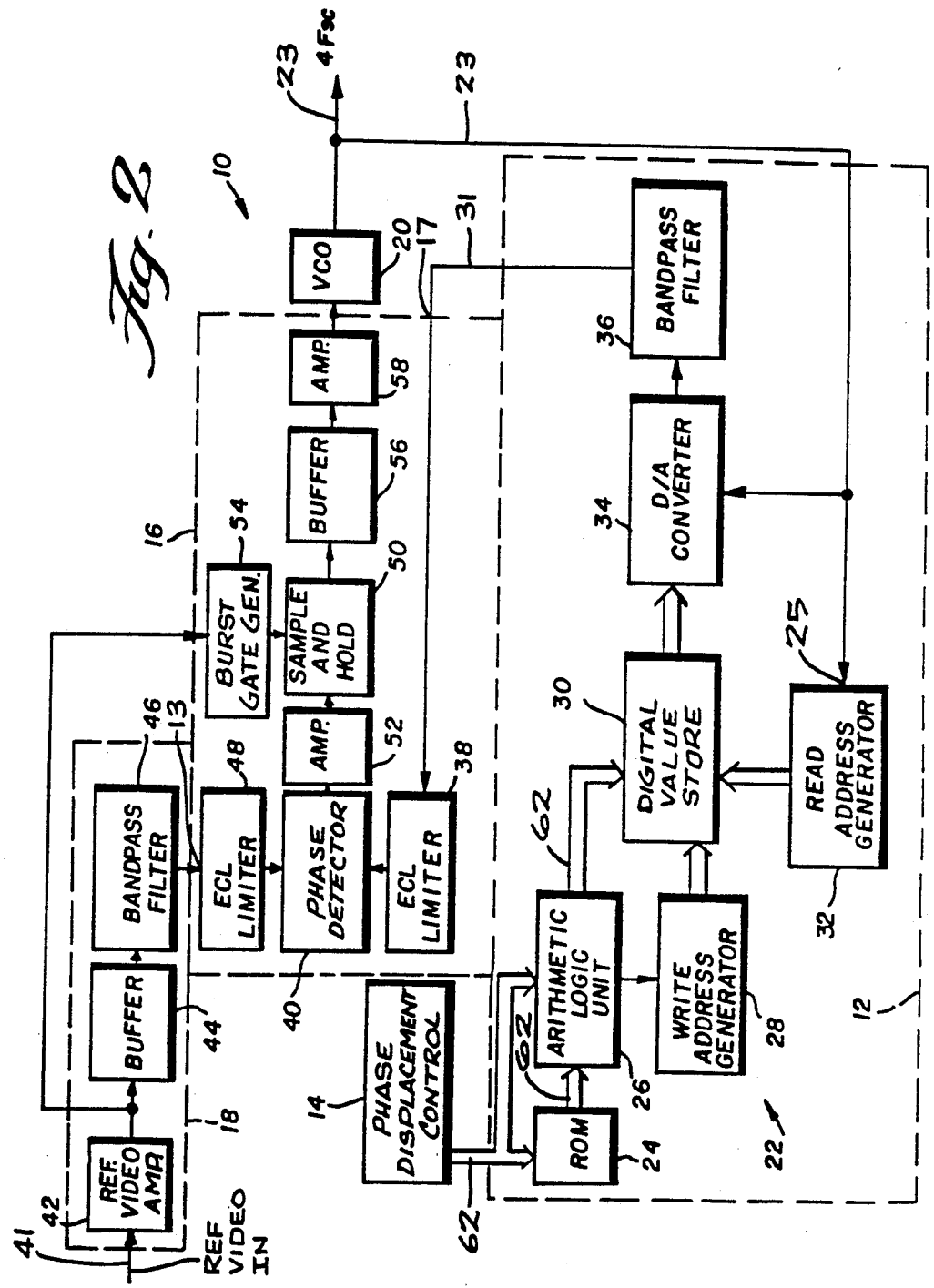

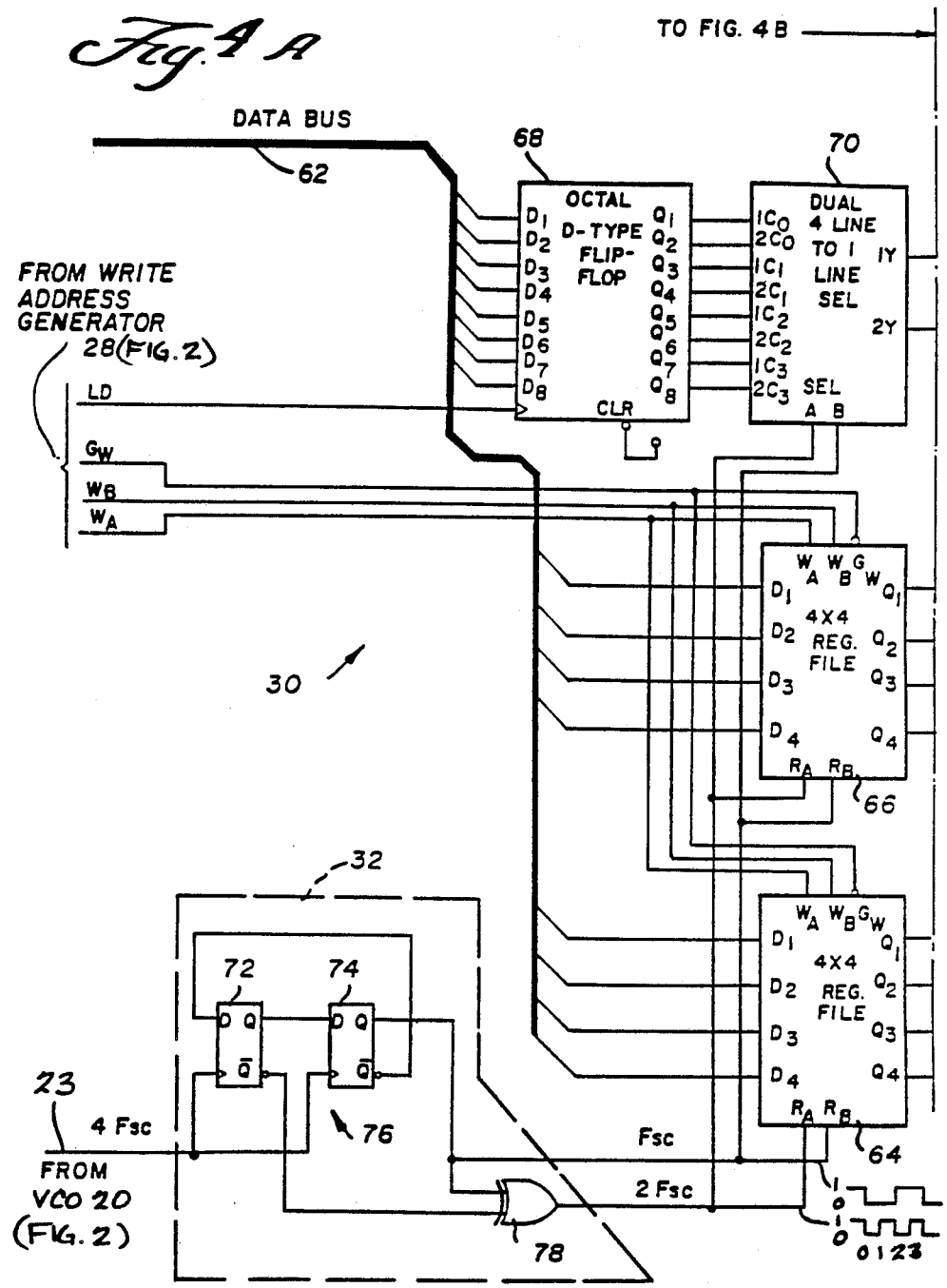

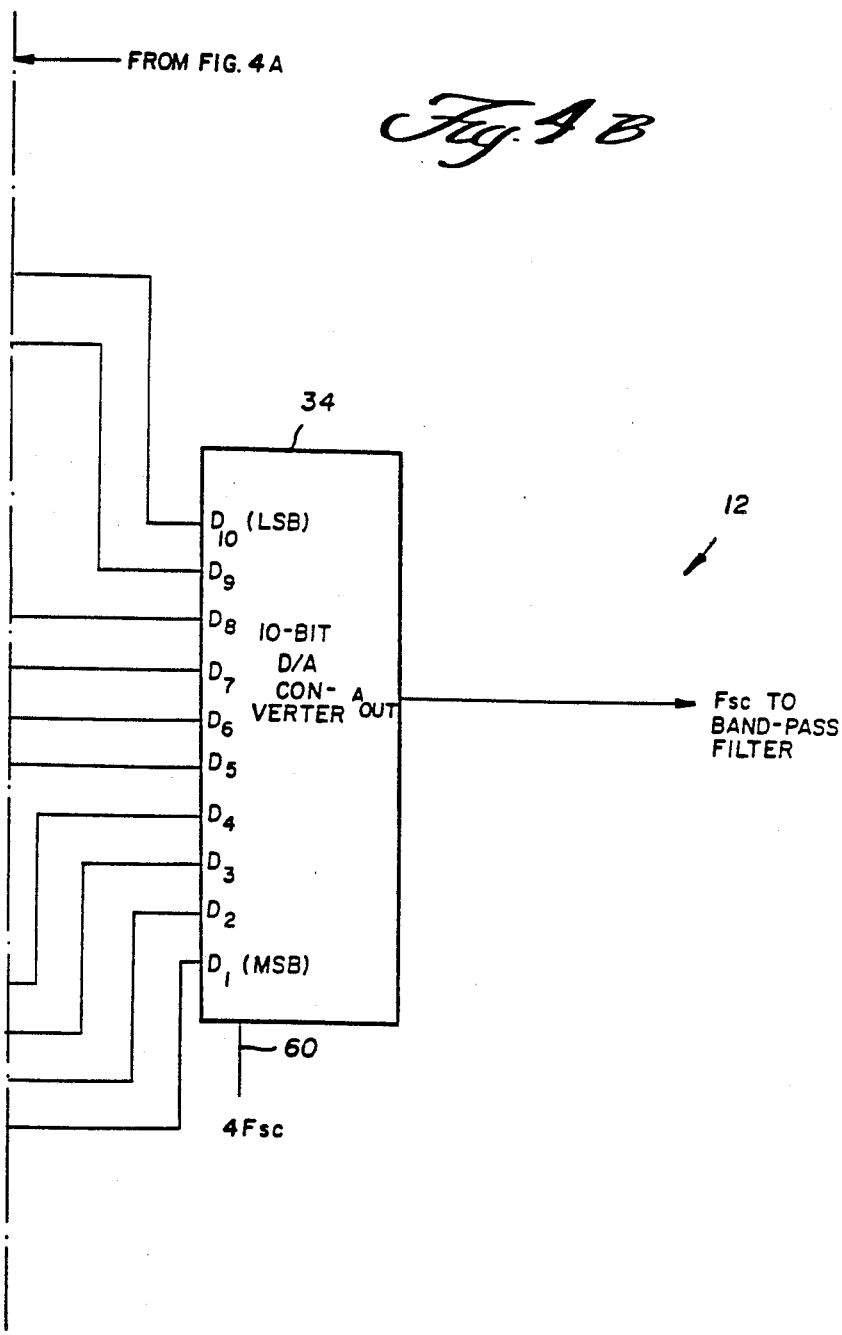

DIGITAL-BASED PHASE CONTROL SYSTEM

BACKGROUND OF THE INVENTION

The invention relates to a digital-based phase control system and more particularly to such a system capable of providing phase adjustment of an output signal with respect to a reference signal over a wide range of precisely controlled increments.

Phase control systems are known to provide an output signal which has a predetermined phase with respect to a reference signal. To obtain the foregoing it is generally known to utilize a phase-locked loop including a phase comparator and a voltage controlled oscillator (VCO). The output of the phase comparator is connected to the input of the VCO. The phase comparator has two inputs, one of which receives a reference signal and the other input receives an output signal from the VCO, which is generally referred to as the feedback signal. The phase comparator compares the phases of its two input signals and provides a phase error signal. In response to the phase error signal the VCO adjusts the phase of its output signal to minimize the phase error signal.

It is further known to control the phase of the output signal from the VCO to have a predetermined phase displacement with respect to the reference signal. In the known devices such phase displacement is obtained by utilizing analog or digital phase shifting or delay devices connected in the feedback signal path, or alternatively, in the reference signal path of the phase-locked loop. Known analog signal phase shifting or delay devices may include networks comprising resistors (R) and capacitors (C), or inductors (L) and capacitors (C), analog LC delay lines or analog shift registers implemented for example by charge-coupled devices. The desired phase displacement may be adjusted by varying the R, L or C parameters of the above networks or delay lines, by varying the length of the delay lines or by varying the frequency of a clock signal applied to the charge-coupled devices. However, the above-indicated analog phase shifting and delay devices are suceptible to drift due to aging and environmental changes, such as temperature and humidity. The drift must be compensated for by frequent operator adjustments and maintenance. While drift compensation circuits are known, they do not eliminate the problem entirely. In addition, most of the above-indicated devices are not suitable for remote control.

One type of known digital phase shifting or delay devices includes one or more monostable multivibrators including analog time-out circuitry comprising R and C or L elements, or a voltage-controlled constant current source replacing the R element. The time-out circuitry determines the duration of an output pulse whose trailing edge is used to determine a desired phase displacement. While it is possible to obtain phase adjustment by varying the R or C parameters of the time-out circuitry or by varying the control voltage of the current source, respectively, these devices are unstable.

Another type of digital devices includes one or more monostable multivibrators with digital time-out circuitry, for example utilizing counters. Phase adjustment of the output signal may be obtained by selecting different digital time-out values loaded into a time-out counter. However this type of digital phase shifting or delay device becomes relatively expensive when a large range of phase adjustment and fine resolution are required.

Digital shift registers are also known to be utilized to obtain output signal phase adjustment in phase-locked loops. Here phase adjustment may be obtained by varying the clock frequency of the shift register or the length of the register. However in applications requiring phase adjustment within a wide range and with fine resolution, the implementation is expensive.

The present invention eliminates the above-described disadvantages of known phase control systems by providing an adjustable digital-based phase control system in which the phase of the output signal with respect to a reference signal may be selectively changed with a high degree of resolution, precision, stability and repeatability. At the same time the system of the invention is relatively easy to implement and economical.

In accordance with the present invention a function generator is provided which generates a predetermined periodic waveform having a selected phase displacement with respect to a phase control input signal received by the function generator. A phase controlled oscillator device which provides an output signal having a phase corresponding to the phase relationship between a first and a second input signal thereof, receives as one of its input signals the predetermined waveform from the function generator. The function generator has a phase control input which receives either the output signal from the phase controlled oscillator device or the reference signal. The other input signal of the phase controlled oscillator device is the other one of the output signal or the reference signal, which is not received by the phase control input of the function generator. An adjustable phase displacement control device may be coupled to the function generator for controlling the selected phase displacement of the predetermined waveform.

In the preferred embodiment a digital function generator is utilized in a phase-locked loop. The phase-locked loop has a phase comparator which compares a reference signal to a feedback signal. The error signal from the phase comparator controls a voltage controlled oscillator (VCO). For the purpose of this description we refer to the combination of the phase comparator and VCO as phase-controlled oscillator. The digital function generator generates a sine waveform from stored digital representations of sine waveform samples. The selected phase displacement of the output signal is determined by a phase displacement control device. The function generator generates a waveform from a set of samples representing a sine wave having the selected phase displacement. The VCO provides the output signal from the phase-locked loop which signal in turn is used as a clock for clocking the selected samples in order to produce the sine wave applied from the function generator to the phase comparator as a feedback signal. The resulting feedback signal received by the phase comparator carries the necessary information about the phase of the output signal.

In an alternative embodiment the function generator receives the reference signal at its phase control input and it applies a reference signal having a desired phase displacement to the phase comparator. In this embodiment the phase comparator receives at its other input a feedback signal from the VCO.

It is a significant advantage of the present invention that the phase displacement of the feedback or reference signal is provided by a digital function generator which generates a predetermined periodic signal waveform from stored digital values representing samples of that waveform. A desired phase displacement of that periodic waveform is provided in a digital manner by selecting and storing a set of digital values representing samples which correspond to the phase displaced waveform.

In the preferred embodiment the set of selected digital values representing samples is applied to a digital-to-analog (D/A) converter which in turn generates from these samples a periodic signal having the desired phase displacement. In the preferred embodiment such sets of four digital values representing samples of a sinusoidal waveform are calculated from digital values of a sinusoidal function stored in a read only memory (ROM). The ROM stores 360 such values representing that function in a range from 0 to 90 degrees. Thus a fine resolution of stored values, equal to ¼ of a degree, is obtained.

The desired phase displacement indicated by the phase displacement control device may be mathematically expressed as:

$$\text{displacement alpha} = (k * 90 \text{ degrees} + \text{gamma}) \quad (1)$$

where k is an integer number in the range of 0 through 3, and gamma is an angle in the range of 0 through 90 degrees. In the preferred embodiment the sine wave is defined by four samples equally spaced from each other by a 90 degree phase displacement. Because of the well known symmetrical properties of the sinusoidal function, the required four samples of the sine wave may be calculated based on well known trigonometrical equations from two values of the sinusoidal function at the angles of gamma degrees and (90-gamma) degrees.

The set of four digital values representing four samples is stored and read from the storage cyclically by a clock signal provided as the VCO output signal.

The thusly read digital valves representing samples are supplied to the D/A converter which produces a step function signal. The step function signal is applied to a bandpass filter which passes the fundamental frequency component of the step function signal as a sinusoidal feedback signal to one input of the phase comparator.

The phase comparator compares the phase of the feedback signal to the previously described reference signal and the resulting error signal therefrom is utilized to control the VCO in order to change the phase of its output signal. This leads to the cancellation of the phase difference between the reference and feedback signal at the input of the phase comparator. In this manner, the output signal from the VCO is maintained at a phase offset from the reference signal by an amount determined by the phase displacement control device.

It is seen from the foregoing description that in accordance with the present invention a desired phase displacement of a feedback or reference signal in a phase-locked loop is obtained by generating a periodic signal waveform having the desired phase displacement using digital-to-analog conversion of stored digital values representing samples of the waveform. The stored values are calculated from digital values of a periodic function corresponding to the desired phase displacement indicated by the phase displacement control device. Because the function generator utilizes substantially digital signal processing techniques, a high degree of stability, accuracy and repeatability while also a desired high degree of resolution of the phase displacement are obtained, as it will also follow from the further detailed description.

In addition to other distinguishing features, the phase control system of the invention thus distinguishes from the previously known systems in that it generates a new periodic signal of a selected waveform, such as sine wave, saw tooth, or other, having a desired phase displacement, for phase comparison in a phase-locked loop. In contrast thereto the known phase control systems utilize phase shifters which merely delay the feedback signal but do not generate a new phase-adjustable feedback signal for the phase comparison.

BRIEF DESCRIPTION OF THE DRAWINGS

FIG. 2 is a more detailed block diagram corresponding to FIG. 1A as utilized in a color television signal processing device.

FIGS. 4A and 4B are consecutive parts of a detailed circuit diagram showing an example of implementation of a portion of the function generator of FIG. 2.

DETAILED DESCRIPTION

Figure 1A:
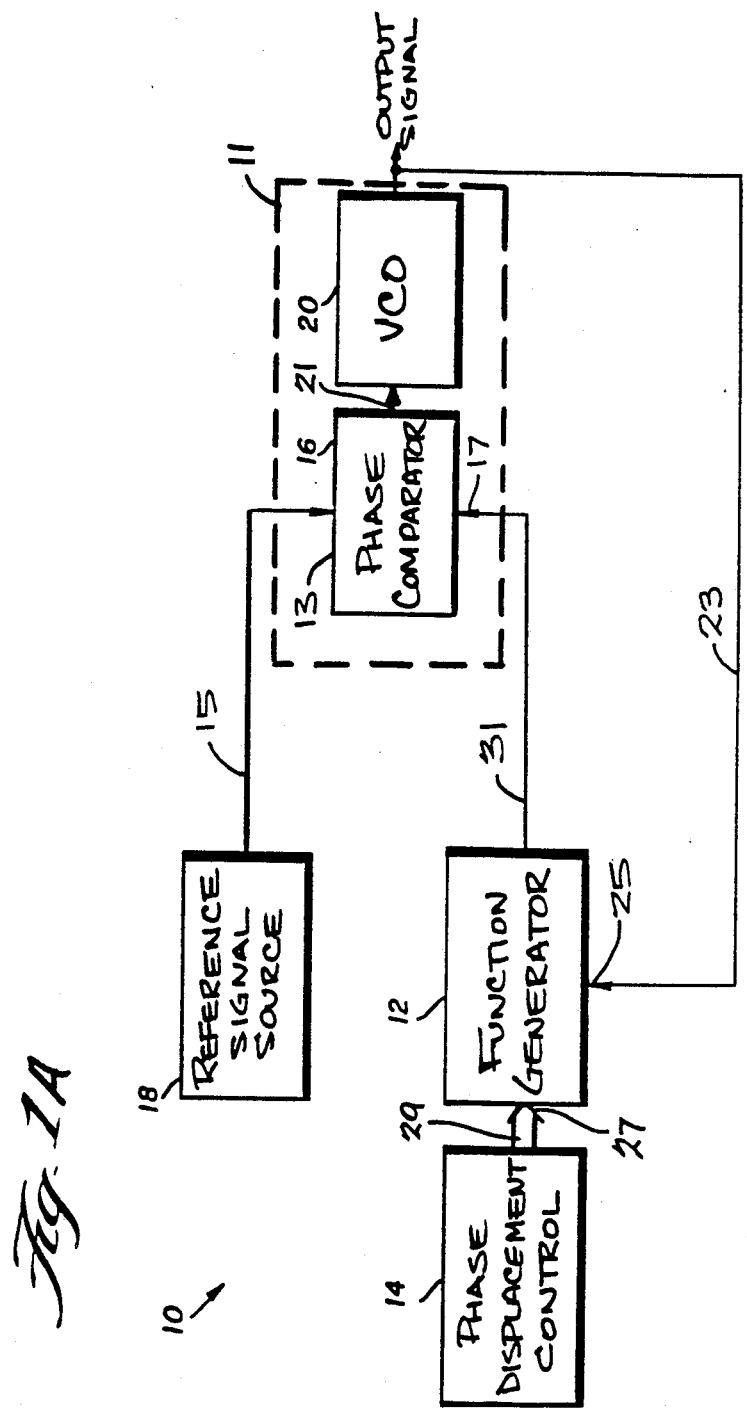
FIG. 1A is a block diagram showing a preferred embodiment of the phase control system in accordance with the invention.

To facilitate comparison, like elements will be designated by like reference numerals in all drawing Figures.

Referring now to FIG. 1A, there is shown a preferred embodiment of a digital-based phase control system 10 in accordance with the present invention. A phase comparator 16 receives at its first input 13 a reference signal provided by a reference signal source 18 on line 15. At its second input 17 the phase comparator 16 receives a feedback signal applied thereto via line 31. The comparator 16 compares the phases of its two input signals and provides a resulting phase error signal on line 21 applied to a voltage-controlled oscillator (VCO) 20. An output signal from the VCO 20 is applied via line 23 to a phase control input 25 of a function generator 12. The function generator receives at its other input 27 a control signal via line 29 from a phase displacement control device 14. The function generator generates a predetermined periodic waveform which in the preferred embodiment is a sine wave. The phase relationship of that generated waveform with respect to the phase of the signal received at the phase control input 25 is determined by the phase displacement control device 14. The thusly generated signal is applied from the function generator 12 via line 31 as the previously mentioned feedback signal to the second input 17 of the phase comparator 16 for comparison with the reference signal applied to its first input 13.

Since the timing of the signal on line 31 from generator 12 is determined by the timing of the output signal on line 23, the phase of the signal on line 31 is maintained at a constant phase offset relative to the phase of the output signal on line 23. In this manner, due to the phase-locked loop action the output signal is maintained at a phase which is offset from the phase of the reference signal by an amount corresponding to the selected phase displacement.

If the phase of the output signal from VCO 20 changes, as may occur as a result of system operation anomalies, the phase of the signal generated by function generator 12 will change to correct the phase of the output signal with respect to the reference signal as determined by the selected phase displacement. Similarly, the reference signal provided by signal source 18 is normally considered stable. However, it can change in phase. If it does, the phase of the output signal from VCO 20 will follow with a phase displacement determined by the signal generator 12.

Figure 1B:
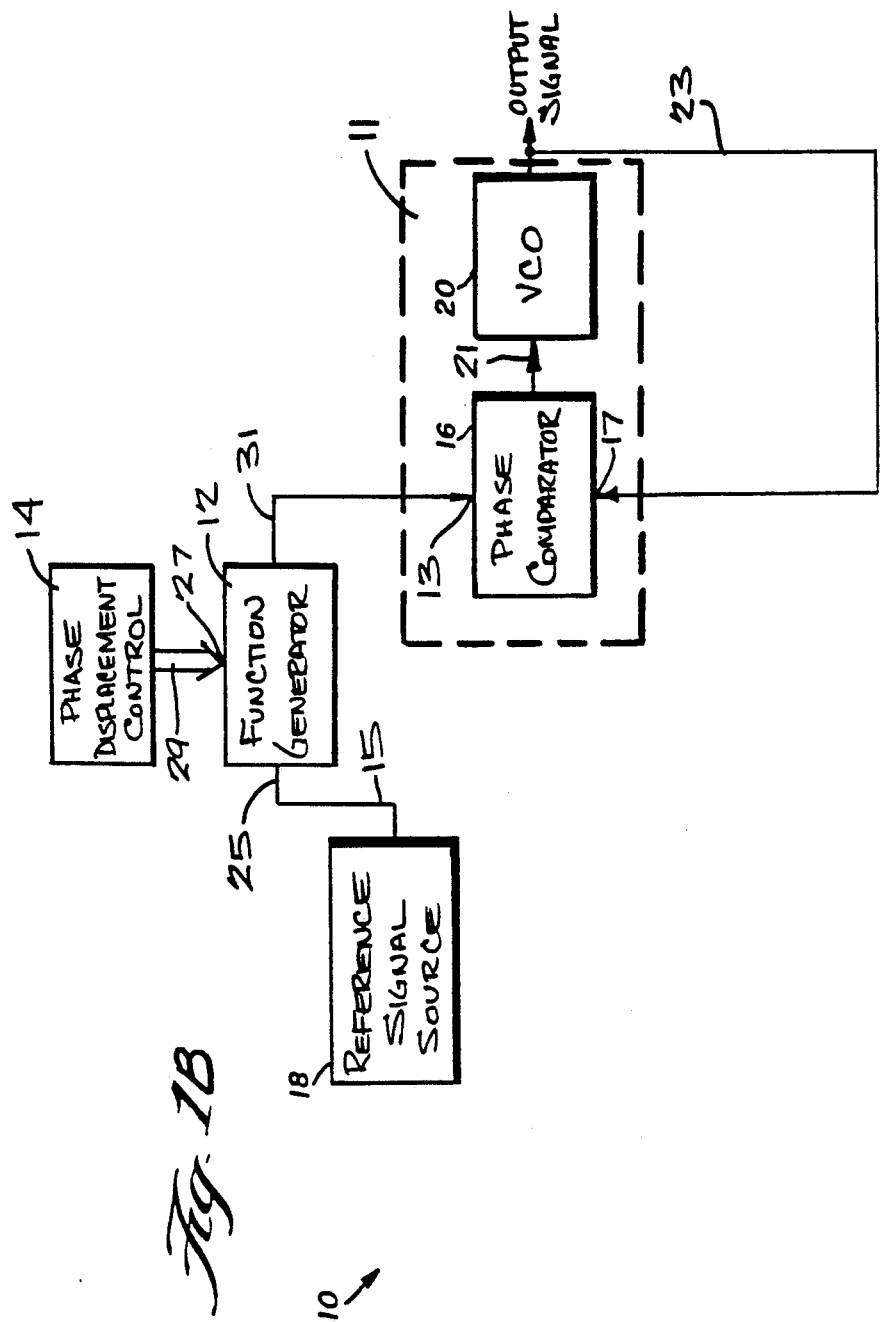
FIG. 1B is a block diagram showing an alternative embodiment of the invention.

FIG. 1B shows an alternative embodiment of the invention. It differs from the embodiment of FIG. 1A in that the function generator 12 is coupled with its phase control input 25 to receive the reference signal on line 15 and its output is coupled via line 31 to the first input 13 of the phase comparator 16. As a further difference from the previously described embodiment of FIG. 1A, the output signal on line 23 from the VCO 20 is coupled as the feedback signal to the second input 17 of the phase comparator 16.

Consequently, in the alternative embodiment of FIG. 1B the phase of the output signal on line 31 from the function generator 12 is displaced with respect to the phase of the reference signal on line 15 by a value determined by the phase displacement control device 14. The phase-displaced reference signal and the feedback signal from the VCO 20 are compared by the phase comparator 16 to produce the phase error signal applied to the VCO 20 via line 21.

It follows from the foregoing description with reference to FIGS. 1A and 1B that in accordance with the present invention the function generator may be coupled in either the feedback or in the reference signal path applied to the different inputs of the phase comparator for phase comparison.

A more detailed description of the preferred embodiment shown in FIG. 1A will now follow with reference to FIG. 2. As an example, an embodiment of the system will be described which is adapted for use in signal processing systems for color television signals. It will be understood, however, that the system of the invention may be utilized for processing other types of signals as well.

With further reference to FIG. 2, the reference signal source 18 is implemented by a reference video amplifier 42, buffer 44 and bandpass filter 46. The reference signal source 18 receives a reference video signal from a conventional reference video generator (not shown) at the reference video amplifier 42. The reference video signal is a composite television signal having horizontal sync, vertical sync, and color burst synchronizing signal components. Although these synchronizing components are extracted from the reference video input it is the color burst portion of this signal which is used as the timing reference for the master clocks in digital television equipment. The color burst is a defined interval of between eight and eleven cycles of stable chrominance (color) subcarrier signal.

The phase comparator 16 is preferably implemented by a phase detector 40, two emitter coupled logic (ECL) limiters 38, 48, each coupled to one input of the phase detector 40, two amplifiers 52, 58, a burst gate generator 54, a sample and hold circuit 50 and a buffer 56.

The video signal received on line 41 is amplified in amplifier 42 and transmitted through buffer 44, bandpass filter 46 and a first ECL limiter 48 to one input of the phase detector 40. Filter 46 serves to separate the chrominance signal including color burst from the composite video signal prior to limiting in the ECL limiter 48. The ECL limiter 48 converts the output signal from filter 46 to a square wave for phase comparison in detector 40. The phase error signal from the phase detector 40 is amplified in amplifier 52 and applied to the sample and hold circuit 50. The sample and hold maintains a signal representative of the phase error signal at the value produced at the occurrence of color burst of the reference signal during the interval between successive occurrences of the color burst. To this effect the burst gate generator 54, coupled to receive the reference video signal from amplifier 42, supplies a gate pulse to the sample and hold 50 during the interval when the color burst is detected. The sample and hold 50 holds the detected phase error signal value between the intervals of the color burst.

The output signal from the sample and hold 50 passes through the buffer 56 and amplifier 58 to the VCO 20, which is preferably implemented by a crystal VCO. The VCO produces an output signal on line 23 which has a frequency of four times the subcarrier frequency (4Fsc). A 4Fsc frequency signal is commonly employed in digital color television signal processing devices, such as digital time base correctors, to control the clocking of the digital television signals through the device.

As it will follow from further detailed description, in the embodiment of FIG. 2 the output signal from the VCO 20 on line 23 is utilized to clock an output signal from a read address generator 32, utilized in the function generator 12. Thus the clock input 25 of the read address generator 32 corresponds to the previously described phase control input of the function generator 12 of FIG. 1A.

The other ECL limiter 38 of the phase detector 16 receives a sine wave signal via line 31 which is generated by the function generator 12 and has a desired phase relationship with reference to the clock signal on line 23, as it will follow from further description. The ECL limiter 38 is substantially identical to the previously described ECL limiter 48. The sinewave signal to limiter 38 is applied from a bandpass filter 36 included in the function generator 12 and which filter 36 is substantially identical to the bandpass filter 46 of the reference signal source 18. It will be understood that having a substantially identical corresponding filter and limiter coupled to each signal input of phase detector 40 generally causes those signals to undergo the same delays, so that there is a minimum of relative delay between the two signals produced by these circuits. Also, should the delays provided by these two sets of filters and limiters change due to change of environmental conditions or aging of components, in this configuration these delays will change substantially identically and thus will not influence the phase relationship within the phase-locked loop. The phase detector in the preferred embodiment is a balanced mixer which produces an error signal which is indicative of the phase difference between signals derived from the reference video signal and the feedback signal provided by the function generator.

A more detailed description of the function generator 12 and the phase displacement control device 14 with reference to FIG. 2 is provided below. The phase displacement control device 14 in the present application is preferably implemented by an operator-controlled keyboard having keys dedicated to selecting a phase displacement, such as is well known to be utilized to control the signal processing system for color television signals for selection of a desired phase displacement. The device 14 produces a signal identifying the phase displacement selected by the operator indicated by a quadrant number and phase displacement angle within the quadrant. The phase displacement within the quadrant is used to address a read only memory (ROM) 24 and the quadrant number is applied to an arithmetic logic unit (ALU) 26.

In the preferred embodiment ROM 24 stores an array of digital values of a sinusoidal function between 0 degrees and 90 degrees. These values make up the first quadrant of a sine wave. Any one of the other quadrants could also be used for providing phase adjustment over a full 360 degrees range. In the preferred embodiment, 360 actual amplitude values are stored, one for each quarter degree angle increment, to provide a fine resolution of one quarter of a degree for phase adjustment. As will be seen from the following discussion, it is sufficient to store the values for one full quadrant in order to provide phase adjustment up to a full cycle. Of course, to obtain one quarter of a degree resolution, all the 1440 amplitude samples corresponding to a complete sine wave cycle over a 360 degree range could be stored in ROM but this is wasteful of memory space. Furthermore, by only storing one quadrant of sine wave values in ROM, only 9 bits need to be stored to achieve a 10 bit resolution over the entire 360 degree cycle. The 10th bit is obtained by assigning a proper polarity to each 9 bit sample depending whether it represents a positive or negative sine wave amplitude, as it will be described below.

As it is well known in the art, when amplitude values of a sine wave within any quadrant are known, the sine wave may be recreated from these values over a full 360 degree range, utilizing well known trigonometric equations. It is further known that a sine wave may be generated when two or more samples thereof are given.

Thus, in response to the signal applied from the phase displacement control device 14 which signal represents a selected phase displacement, ROM 24 applies two of the stored digital values to the arithmetic logic unit (ALU) 26 via bus 62 as follows. One of these values corresponds to the amplitude of the sine wave at the selected angle gamma of phase displacement as it has been indicated previously by equation (1). The other value applied to ALU 26 from ROM 24 is an amplitude value at a complementary angle (90-gamma) degrees of phase displacement. The ALU 26 derives another two digital values from the two received values to obtain a set of 4 digital values representing samples of the sine wave, spaced at 90 degree intervals. These 4 digital values thus represent four equally spaced amplitude values of the sine wave.

For a selected phase displacement of alpha degrees the set of four thusly provided values correspond to sine wave amplitudes at the following angle values of a 360 cycle: alpha; (90 degrees+alpha); (180 degrees+alpha); (270 degrees+alpha). It is known that because of the symmetry of sinusoidal function, of these four samples each two pairs have the same absolute value of amplitude, that is the same magnitude, and thus differ only in polarity. One pair of samples having the same magnitude occur at alpha and (180 degrees+alpha) degrees, while the second pair of samples occur at (90 degrees+alpha) and (270 dregees+alpha) degress.

In addition, because of the symmetry of sinusoidal function, the magnitude of samples at (90+alpha) and (270+alpha) angles is the same as at (90 degrees—alpha).

Below are examples of angle values at which the set of four digital values representing sine wave amplitudes may occur:

For alpha=30 degrees, the four sample values will be at 30, 120, 210 and 300 degrees of the sine wave;
For alpha=62 degrees, the four sample values will be at 62, 152, 242 and 332 degrees;
For alpha=0 degrees, the four sample values will be at 0, 90, 180 and 270 degrees.

It is seen from the foregoing description that the ALU 26 may calculate the value for the other two samples utilizing the respective values of the two samples received thereby from ROM 24 and based on the information indicating the quadrant in which the selected phase displacement angle alpha obtained from the phase displacement control device 14 is located.

Figure 3A:
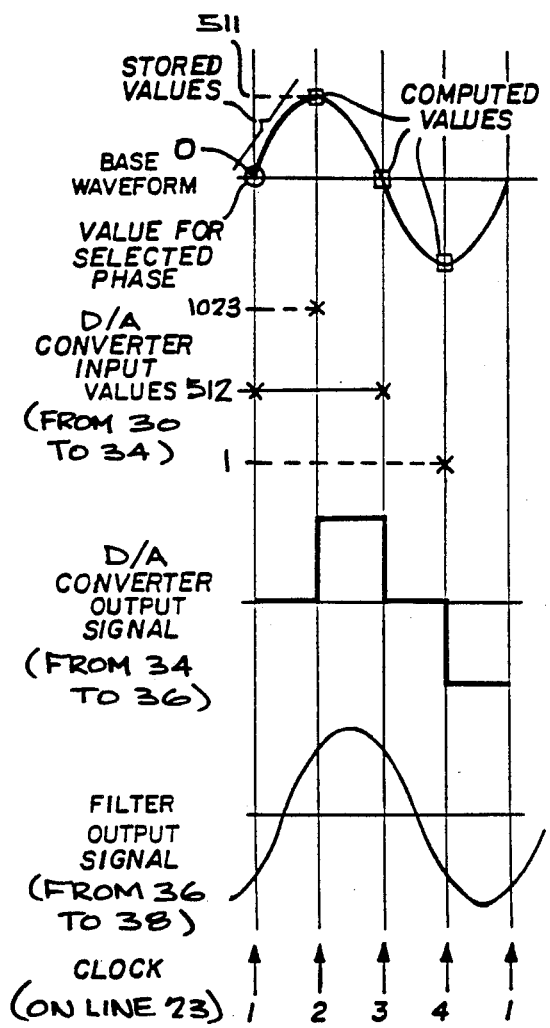
FIGS. 3A and 3B are idealized timing diagrams showing examples of continuous waveforms generated by the function generator in accordance with the present invention.

Referring now to FIG. 3A, the top waveform is a sine wave having zero degrees phase displacement with respect to the vertical lines which represent reference timing points, or clocks spaced at 90 degree increments along the waveform. The thickened portion of the waveform in the first quadrant represents the digital values which are stored within ROM 24. The respective numbers representing sine wave amplitude values stored in ROM 24 in accordance with the preferred embodiment are calculated utilizing the following equation:

$$A(n) = 511 \sin (2\pi n/1440) \qquad (2)$$

where n is a particular sample number between 0 and 360 corresponding to a selected phase angle between 0 and 90 degrees.

The four identified points on the curve represent amplitude values at 90 degrees increments which may be used to represent the sine wave. In this example alpha=0, because there is no phase displacement between the reference timing points and the sine wave, since the first and third reference points are at the horizontal axis crossing and the second and fourth points are at the points of peak amplitude.

As it has been previously described, the ROM 24 stores amplitude values of the sine wave corresponding to the first quadrant, that is, between 0 and 90 degrees, in one-quarter degree increments, that is 4×90=360 amplitude values are stored therein. As it is further shown in FIG. 3A the values stored in the ROM range from a minimum amplitude value represented by number 0, assigned to the amplitude at zero crossing to a maximum amplitude value represented by number 511, assigned to the peak of the sine wave. These two extreme values are plotted on the vertical axis and designated "stored values".

As it has been described previously with reference to the block diagram of FIG. 2, the ROM 24 applies two stored amplitude values to the arithmetic logic unit 26. One value corresponds to the amplitude of the sine wave at a selected degree of phase displacement. Assuming that a selected phase displacement alpha=0 degrees is received from phase displacement control 4, then the corresponding sine wave amplitude value obtained from ROM 24 is zero, as it is seen from FIG. 3A. The other value obtained from ROM 24 is an amplitude value at a complementary angle phase displacement of (90°−0°) which corresponds to a stored digital value of 511.

From these two values the ALU 26 produces a set of four values: two with positive sign and two with negative sign. Thus in this example the four amplitude values produced by the ALU 26 are: 0, +511, 0, −511.

As it has been previously described, 511 is the stored number in ROM 24 representing the maximum sine wave amplitude and 1440 is the total number of samples for a complete 360 degree interval. In the preferred embodiment the ALU adds a positive constant offset value to all four thusly produced values to ensure that all sine wave amplitude values are positive for ease in data handling. That added constant value in the preferred embodiment is 512. Thus the resulting set of four values applied from the ALU 26 is 512, 1023, 512 and 1. These values represent the four designated sine wave amplitudes at vertical lines 1 to 4 in FIG. 3A and are indicated on the vertical axis below the sine wave as "D/A converter input values."

As another example, using the information provided in FIG. 3A, suppose the selected phase displacement alpha is 180 degrees. In this case, the same two values (0, 511) would be applied from ROM 24, but the logic unit 26 would also receive information indicating that the phase displacement angle is in the third quadrant. The same four values are applied from ALU 26 as for zero phase displacement, but the order of values is changed in order to represent a sine wave which is phase displaced by 180 degrees from the one shown in FIG. 3A. The order of amplitude values which logic unit outputs then would be: 512, 1, 512, 1023.

Figure 3B:
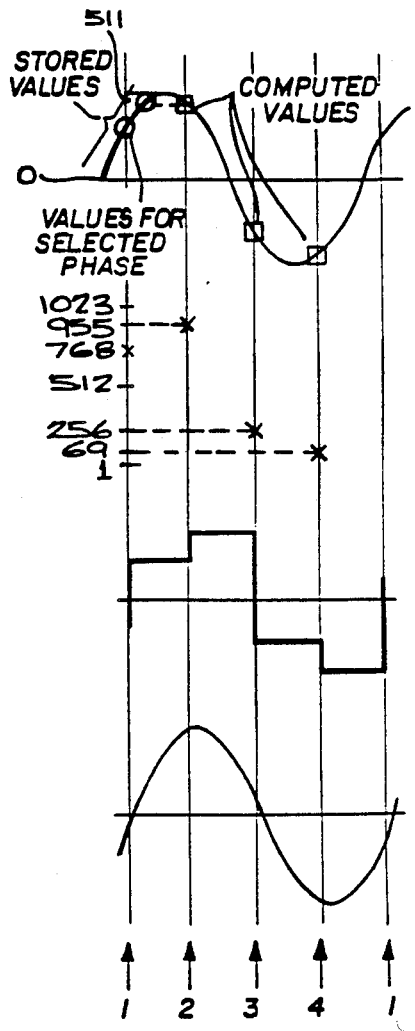

FIG. 3B shows an example of four amplitude values representing a sine wave having a 30 degree phase displacement with respect to the reference timing points corresponding to those previously described with reference to FIG. 3A. In this example ROM 24 receives from phase displacement control 14 an appropriate address corresponding to a selected 30 degree phase displacement. The stored value for the selected phase displacement calculated from equation (2) is 256. The complementary angle is 60 degrees (90 degrees minus 30 degrees) and is represented by a corresponding stored integer number 443, which is calculated from equation (2) and rounded to the nearest integer number. These two values are applied to logic unit 26 which also receives an input signal from phase displacement control device 14 indicating that the selected 30 degree phase displacement is in the first quadrant. From the three values received by the logic unit 26, the amplitudes and sequence of the four values at 90 degree increments required to define the sine wave with the selected phase displacement are computed. With further reference to FIG. 3B, the first amplitude value of the sine wave having a 30 degree phase displacement is 512+256=768. The second value is at what would be considered 120 degrees of the sine wave cycle and has a magnitude of 512+443=955, which corresponds to the unsigned magnitude of the sine of 60 degrees. The third value at 210 degrees has a magnitude of 512−256=256 and the fourth value at 300 degrees has a magnitude of 512−443=69. These four values are output from the logic unit 26 in the sequential order 768, 995, 256, and 69. They are represented by the x's on the vertical 90 degree increment lines 1 to 4 and designated "D/A converter input values".

If the selected phase displacement angle had been 120 degrees, then the appropriate sequence of amplitude values would be 995, 256, 69, and 768. Similarly, if the selected phase displacement angle had been 210 degrees the sequence of the values would be 256, 69, 768, and 955. In all of these cases, the amplitudes output from ALU 26 would be the same, but in different order depending on the quadrant of the required phase displacement angle.

The above-described set of four digital values representing amplitude values of a sine wave having a desired phase displacement are applied from the ALU 26 via the data bus 62 to a phase displaced sine wave value store 30. It is an addressable store which receives the set of four values from the ALU 26 and stores these values at addresses determined by a write address generator 28. In the preferred embodiment the phase displacement control device 14, the ROM 24, the ALU 26 and the write address generator 28 are included in a microprocessor control system of which only the above-indicated elements are shown. The previously mentioned read address generator 32 cyclically accesses the addresses of the four sample values in the store 30 in a predetermined sequence and at a frequency determined by the clock signal applied thereto on line 23 from the VCO 20. The store 30 applies the thusly accessed values to a digital-to-analog (D/A) converter 34. The particular way of storing and accessing these values will be described in more detail with reference to FIGS. 4A and 4B.

The D/A converter 34 receives the digital values read from the store 30 and converts them into corresponding analog voltage values. With further reference to FIGS. 3A and 3B, examples of digital values received by converter 34 are shown on the time chart as "D/A converter input values." The analog voltage produced by converter 34 is shown as the "D/A converter output signal". This converter output is in the form of a step signal and is applied to a bandpass filter 36 having a center frequency substantially equal to the frequency of the chrominance subcarrier signal of the color television signal, which also serves as the reference signal. The subcarrier frequency of the video system is referred to as Fsc as it has been previously described. Filter 36 prevents harmonics of the Fsc frequency from reaching the phase comparator 16 and converts the analog voltage received from converter 34 into a smooth, continuous sine wave as shown under "filter output signal." As it has been above described, comparator 16 includes an emitter-coupled logic (ECL) limiter 38 which converts the filter output signal to a square wave, the transitions of which correspond to the zero crossings of the phase-displaced sine wave. The square wave is produced using conventional techniques for use in the phase detector 40.

Referring now particularly to FIGS. 4A and 4B, a preferred implementation of the phase displaced waveform value store 30, read address generator 32 and D/A converter 34 of value generator 12 are shown. The digital numbers computed by the arithmetic logic unit 26 are output as 8-bit words which are read into value store 30 over a conventional buffered data bus 62. In the preferred embodiment, 360 angular position increments within the 0 degree to 90 degree range of the interval of sine wave values stored in ROM 24 shown in FIG. 2 are represented by 9-bit digital numbers. Ten bits are used to represent the calculated digitally represented amplitude values transferred to value store 30. Each 10-bit number is divided into blocks or subsets of the ten bits. The eight most significant bits for each of the four numbers are first transmitted. The remaining two least significant bits from each of the four numbers are combined into a single 8-bit "number" or block of digits in a predetermined order. The eight most significant bits are broken into two smaller blocks of four bits with the more significant block of bits being clocked into a 4×4 register file 64, for example type LS670 and the other block of four bits being input into another 4×4 register file 66. Files 64, 66, also jointly referred to as first register, each store four 4-bit numbers which are written into respective predetermined address locations by write signals WA and WB which are received from write address generator 28, shown in FIG. 2. Writing in these files is enabled by an enable write signal GW which is also received from the write address generator. As previously discussed, the remaining two bits from each of the four numbers are combined into a single eight bit number and fed into an octal D-type flip-flop, for example type LS273, functioning as a data register 68. Data register 68, also referred to as second register, is loaded by a load signal LD received from write address generator 28 to load the number into the register. When a number is to be output from the registers, the total combination "number" in register 68 is output to a dual, four-line to one-line selector 70, for example type LS153. The 8 bits are stored in groups of two corresponding to the digital numbers of which they form a part, as shown, with each group being selectable depending on the address signal provided by read address generator 32.

The read address generator produces a clocked address signal, in the form of cycled addresses for reading out to D/A converter 34, at times determined by the output signal, the digital numbers stored in registers 64, 66, 68. The converter is connected to registers 64, 66 to receive the eight most significant bits of each number and is connected to selector 70 for receipt of the remaining two least significant bits, as shown.

The output timing signal 4Fsc provided by VCO 20 of FIG. 2 is received on line 23 at the clock terminals of a pair of D-type flip-flops 72, 74 forming a ring counter shown generally at 76. As shown, the output of flip-flop 72 is connected to the data input of flip-flop 74 and the inverse output of flip-flop 74 is connected to the data input of flip-flop 72 to form a divide-by-four circuit. This results in an output from flip-flop 74 equal to the subcarrier frequency Fsc which is connected to the $R_B$ address or read input terminal of the registers 64, 66 and selector 70. The inverse output of flip-flop 72 and the output of flip-flop 74 are connected to the input terminals of an exclusive-OR gate 78 which provides an output signal having a clocking rate twice the subcarrier frequency 2Fsc. This signal is coupled to the $R_A$ address or read input of the registers and selector 70. The combination of the subcarrier frequency signal and the signal twice the subcarrier frequency signal produces, during each subcarrier frequency cycle, a sequence of the four addresses of the stored numbers. A representative cycle of the Fsc and 2Fsc signals is shown at the two inputs to register 64. It can be seen that for each of the high and low states of the subcarrier frequency signal the two-times subcarrier frequency signal has both high and low states. This creates a series of address signals equivalent to the following binary two digit sequency: (0,0), (0,1), (1,0), (1,1), assuming what is shown as a high state is equivalent to binary 1 and what is shown as a low state is equivalent to binary 0.

The digital values are stored in the registers so that they will be read out from their respective address locations in the proper sequence. The read address generator 32 clocks the digital numbers out of the registers at 4Fsc. It can be seen that the set of four numbers are clocked out sequentially at times determined by the 4Fsc signal and are in phase with it.

Each 10-bit number read out of the registers and selectors is fed into D/A converter 34 which is a 10-bit digital-to-analog converter, for example type TRW 1016 B7C8. As previously described, FIGS. 3A and 3B show examples of two waveforms which are produced by converter 34 for 0 degree and 30 degree phase displacement, respectively. It follows from the foregoing description that the analog step voltage signal output from converter 34 represents a sine wave having a phase offset relative to the output signal from the VCO 20. The phase of this sine wave is compared to the phase of the subcarrier signal of the reference video signal, during the occurrence of the color burst, to produce an error signal which maintains the output signal at a phase having the selected phase offset relative to the reference signal. It should be noted that the "filter output" waveforms shown at the bottom of FIGS. 3A and 3B each have approximately a 45 degree phase delay relative to the clock signals on line 23 at which the signals are clocked out of converter 34. The 45 degree delay results from the operation of converter 34 in conjunction with an idealized bandpass filter. The balanced mixer, used as a phase detector, also introduces a fixed 90 degree phase shift between the reference timing source and the phase offset signal value. This static phase shift and other fixed and stable phase shifts, such as caused by the bandpass filters, are not a problem since the phase displacement control circuit can be calibrated to correct phasing of output video to reference video input.

An important aspect of the present invention, however, is that the signal formed or produced by converter 34 has a predetermined phase offset relative to the output signal on line 23 as determined by the phase represented by the set of digital values in store 30. The phase-locked loop causes the phase of the output signal, relative to the reference subcarrier signal, to be determined by the numerical values received by D/A converter 34.

It will be appreciated with respect to the foregoing disclosure that the function generator 12 provided by the present invention has improved stability, because the phase offset is controlled by numerical values which are not subject to change for the particular phase. It also has improved resolution because it is only limited by the size of the memory and converter. Similarly, it is relatively easy to implement and economical because it does not require components of large memory or register capacity. It also has improved repeatability due to the storing in memory of the specific values used for obtaining a predetermined phase offset. While a device made according to the invention and the preferred method of practicing the invention have been described herein with reference to a particular embodiment, it will be understood by those skilled in the art that other changes in form and detail may be made therein without departing from the scope of the invention as defined in the following claims.

What is claimed is:

1. Apparatus for controlling the phase of an output signal relative to the phase of a reference signal, said apparatus comprising:

phase-controlled oscillator means having a first signal input and a second signal input, for comparing the phases of first and second signals and producing said output signal at a phase corresponding to the phase relationship between said first and second signals;

function generator means having a phase control input, for generating a periodic signal of predetermined waveform and of selected phase displacement relative to the phase of a signal coupled to the phase control input;

means for coupling a selected one of said reference signal and said output signal to the phase control input of said generator means; and means for coupling the first signal input of the comparator means to receive said signal of predetermined waveform and coupling said second signal input of said comparator means to receive the other of said reference signal and said output signal.

2. Apparatus of claim 1 further comprising control means coupled to said function generator means for controlling said phase displacement.

3. The apparatus of claim 2 wherein said function generator means comprises:

sixth means for providing digital values corresponding to amplitude values of said predetermined waveform;

seventh means for storing digital values corresponding to amplitude values of a phase-displaced waveform; and wherein said sixth means is coupled to receive from said control means a control signal indicating a phase angle corresponding to said selected phase displacement and to apply to said seventh means said digital values corresponding to amplitude values of said predetermined waveform having said selected phase displacement, in response to said control signal.

4. The apparatus of claim 2 wherein said predetermined waveform is a sine wave, said function generator further comprising:

eighth means for providing digital values of a periodic function defining said sine wave within a predetermined portion of one since wave cycle;

ninth means for storing digital values corresponding to amplitude values of a phase-displaced sine wave;

said eighth means is coupled to receive from said control means a control signal indicating a phase angle corresponding to said selected phase displacement; and tenth means for receiving from said eighth means selected digital values in response to said control signal, for computing a set of digital values representative of a since having the selected phase displacement and applying the computed values to said ninth means.

5. The apparatus of claim 4 wherein said eighth means stores values defining said sine wave within a selected quadrant of one cycle of said sine wave, said tenth means is coupled to apply to said ninth means a digital value corresponding to an amplitude value at a first phase angle corresponding to said selected phase displacement and a digital value corresponding to an amplitude value at a second phase angle which is complementary to said first phase angle, wherein said control signal indicates a quadrant of said sine wave corresponding to said selected phase angle, and wherein the set of digital values computed by said tenth means represents said amplitude values at 90 degree increments of the sine wave having the selected phase displacement.

6. The apparatus of claim 1 wherein said function generator means comprises:

first means utilizing values of a predetermined periodic function defining said predetermined waveform for providing digital values corresponding to amplitude values of said predetermined waveform having said selected phase displacement;

second means for storing said digital values provided by said first means; and third means for reading said stored values from said second means in response to said signal coupled to said phase control input.

7. The apparatus of claim 6 wherein said third means is coupled to receive said output signal of said phase-controlled oscillator means, to provide a clock signal in phase with the output signal, and to apply said clock signal to said second means for cyclically outputting said digital values stored therein.

8. The apparatus of claim 7 wherein said phase-controlled oscillator means comprises a phase comparator means having said first and second signal input and an output and a voltage controlled oscillator means having an input coupled to an output of said phase comparator means and wherein said function generator further comprises a digital-to-analog converter means for receiving said cyclically outputted digital values from said second means and having an output coupled to one of said first and second inputs of said phase comparator means.

9. The apparatus of claim 6 wherein said function generator further comprises a digital-to-analog converter means coupled to receive an output signal from said second means.

10. The apparatus of claim 9 wherein said function generator further comprises a bandpass filter means coupled to receive an output signal from said digital-to-analog converter means.

11. The apparatus of claim 1 wherein said phase-controlled oscillator means comprises a phase comparator means having said first and a second signal input and an output and a voltage controlled oscillator means having an input coupled to an output of said phase comparator means and wherein said phase control input of said function generator means is coupled to receive an output signal from said voltage controlled oscillator means, and said periodic signal generated by said function generator means is coupled to one of said first and second signal inputs of said phase comparator means.

12. The apparatus of claim 1 wherein said phase-controlled oscillator means comprises a phase comparator means having a first and a second signal input and an output and a voltage controlled oscillator means having an input coupled to an output of said phase comparator means and wherein said phase control input of said function generator means is coupled to receive said reference signal, and said periodic signal generated by said function generator means is coupled to one of said first and second signal inputs of said phase comparator means.

13. An apparatus for controlling the phase of an output signal relative to the phase of a reference signal, comprising:

a phase comparator means having a first and a second input, and an output;

a voltage-controlled oscillator means having an input coupled to said output of said phase comparator means and an output for providing a phase-controlled output signal;

a reference signal source having an output coupled to said first input of said phase comparator means;

a function generator means having a phase control input coupled to said output of said voltage-controlled oscillator means for generating a periodic signal of a predetermined waveform and of a selected phase displacement relative to the phase of said phase-controlled output signal, an output of said function generator means being coupled to said second input of said phase comparator means; and control means coupled to said function generator means for controlling said phase displacement.

14. An apparatus for controlling the phase of an output signal relative to the phase of a reference signal, comprising:

a phase comparator means having a first and a second input, and an output;

a voltage-controlled oscillator means having an input coupled to said output of said phase comparator means and an output for providing a phase-controlled output signal, coupled to said first input of said phase comparator means;

a reference signal source for providing a reference signal;

a function generator means having a phase control input coupled to an output of said reference signal source for generating a periodic signal of a predetermined waveform and of a selected phase displacement relative to the phase of said reference signal, an output of said function generator means being coupled to said second input of said phase comparator means; and control means coupled to said function generator means for controlling said phase displacement.

15. A method of controlling the phase of an output signal relative to the phase of a reference signal comprising:

phase-comparing a first and a second signal and producing an output signal at a phase corresponding to the phase relationship between said first and second signals;

generating a periodic signal of a predetermined waveform and of a selected phase displacement relative to a phase control signal, and wherein:

said phase control signal is one of said reference signal and said output signal;

said first and second signal being said reference signal and said generated periodic signal, respectively, when said phase control signal is said output signal; and said first and second signal being said generated periodic signal and said output signal, respectively, when said phase control signal is said reference signal.

* * * * *